United States Patent
Kim et al.

(10) Patent No.: US 12,190,934 B2
(45) Date of Patent: Jan. 7, 2025

(54) MEMORY WITH ROW HAMMER MITIGATION TECHNIQUE

(71) Applicant: SK hynix Inc., Gyeonggi-do (KR)

(72) Inventors: Woongrae Kim, Gyeonggi-do (KR); Hoiju Chung, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 5 days.

(21) Appl. No.: 17/704,714

(22) Filed: Mar. 25, 2022

(65) Prior Publication Data

US 2023/0162776 A1    May 25, 2023

Related U.S. Application Data

(60) Provisional application No. 63/282,553, filed on Nov. 23, 2021.

(51) Int. Cl.
*G11C 11/406*    (2006.01)
*G11C 11/4076*    (2006.01)

(52) U.S. Cl.
CPC .... *G11C 11/40615* (2013.01); *G11C 11/4076* (2013.01)

(58) Field of Classification Search
CPC .......... G11C 11/40615; G11C 11/4076; G11C 11/40611; G11C 11/408; G11C 11/40603; G11C 2211/4062
See application file for complete search history.

(56) References Cited

U.S. PATENT DOCUMENTS

| | | | |
|---|---|---|---|
| 2017/0117030 A1* | 4/2017 | Fisch | G11C 11/4078 |
| 2020/0042423 A1 | 2/2020 | Mazumder et al. | |
| 2020/0176050 A1 | 6/2020 | Ito et al. | |
| 2023/0094684 A1* | 3/2023 | Kim | G11C 11/40622 365/222 |
| 2023/0128653 A1* | 4/2023 | You | G11C 11/4063 365/218 |
| 2023/0141789 A1* | 5/2023 | Cho | G11C 11/40622 365/222 |

* cited by examiner

*Primary Examiner* — Sultana Begum
(74) *Attorney, Agent, or Firm* — IP & T GROUP LLP (57) ABSTRACT

A memory includes: a memory core; a list storage circuit suitable for storing a weak row list of rows that are vulnerable to a row hammer attack in the memory core; and a row hammer attack detection circuit suitable for selecting rows that are row-hammer-attacked among rows in the memory core as hammered rows, and increasing a probability that the rows stored in the list storage circuit are selected as the hammered rows.

9 Claims, 5 Drawing Sheets

MEMORY WITH ROW HAMMER MITIGATION TECHNIQUE

CROSS-REFERENCE TO RELATED APPLICATIONS

The present application claims priority to U.S. Provisional Patent Application No. 63/282,553, filed on Nov. 23, 2021, which is incorporated herein by reference in its entirety.

BACKGROUND

1. Field

Various embodiments of the present invention relate to a memory.

2. Description of the Related Art

As the degree of integration of a memory increases, the spacing between a plurality of word lines included in the memory decreases. As the spacing between word lines decreases, the coupling effect between the neighboring word lines increases.

Moreover, whenever data is input or output to or from a memory cell, a word line toggles between an active state and an inactive state. As the coupling effect between the neighboring word lines increases, the data in the memory cell coupled to a word line which is disposed adjacent to a frequently activated word line may be damaged. This phenomenon is referred to as row hammering. Since the data of a memory cell is damaged before the memory cell is refreshed due to word line disturbance, there is an issue with the data.

Figure 1:
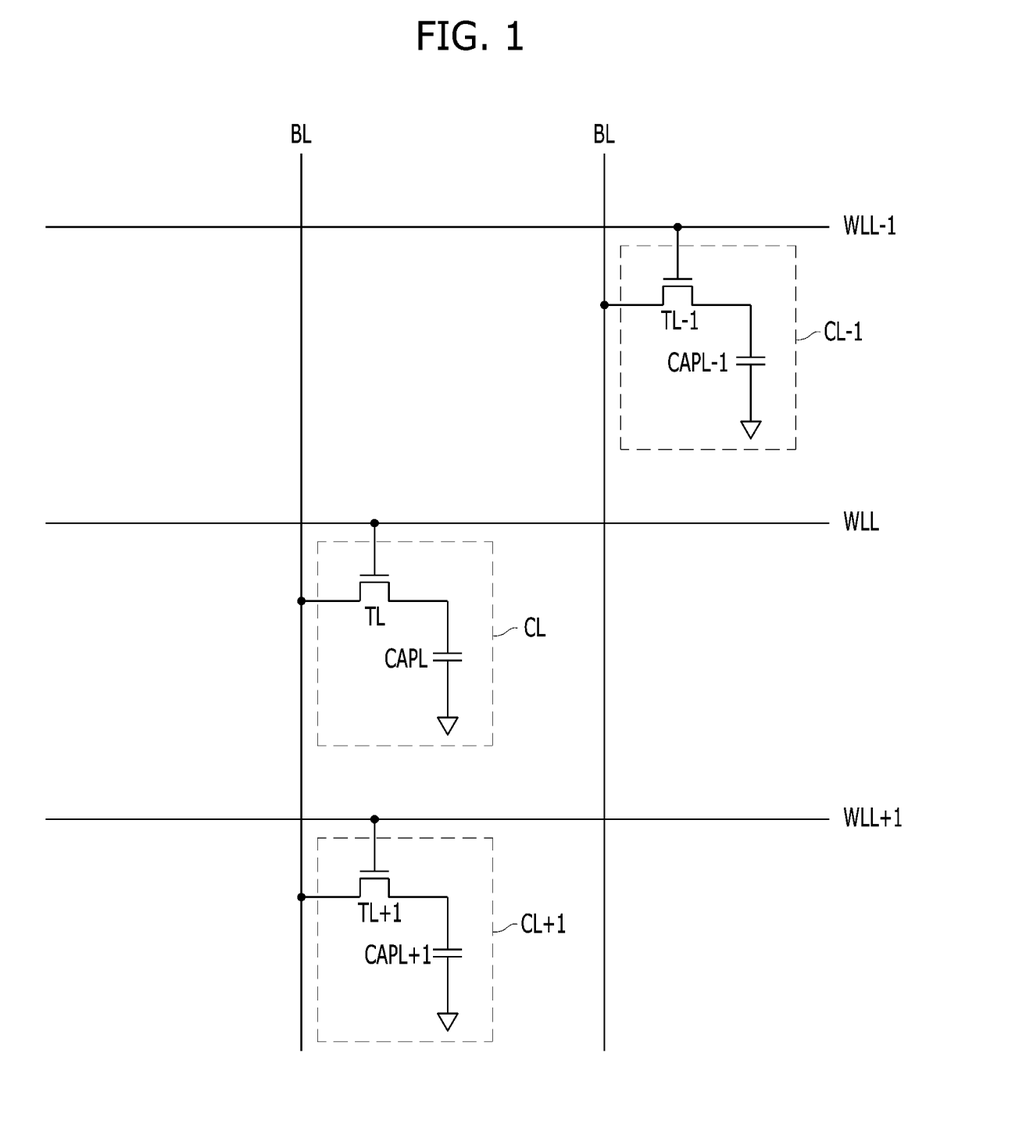
FIG. 1 is a circuit diagram illustrating a portion of a cell array included in a memory as a diagram for describing row hammering.

FIG. 1 is a view illustrating row hammering. FIG. 1 shows a portion of a cell array included in a memory.

In FIG. 1, 'WLL' may correspond to a word line with a large number of activations, and 'WLL−1' and 'WLL+1' may be word lines disposed adjacent to 'WLL', that is, word lines disposed adjacent to the word line with the large number of activations. Also, 'CL' may indicate a memory cell that is coupled to the 'WLL', and 'CL−1' may indicate a memory cell that is coupled to the 'WLL−1', and 'CL+1' may indicate a memory cell that is coupled to the 'WLL+1'. Each memory cell may include a cell transistor TL, TL−1, and TL+1 and a cell capacitor CAPL, CAPL−1, and CAPL+1.

When 'WLL' is activated or deactivated in FIG. 1, the voltages of 'WLL−1' and 'WLL+1' may rise or fall due to the coupling effect occurring between the 'WLL' and the 'WLL−1' and 'WLL+1', which also affects the amount of charges in the cell capacitors CL−1 and CL+1. Therefore, when the 'WLL' is frequently activated and the 'WLL' toggles between an activated state and a deactivated state, the change in the amount of charges stored in the cell capacitors CAPL−1 and CAPL+1 that are included in the 'CL−1' and the 'CL+1' may increase and the data in the memory cell may be deteriorated.

Also, the electromagnetic wave generated when the word line toggles between the activated state and the deactivated state may damage the data by introducing electrons into the cell capacitor of the memory cell coupled to a neighboring word line or leaking electrons from the cell capacitor.

As a method for solving the problem of row hammering, a method of detecting a row (word line) that has been activated multiple times and refreshing the rows neighboring the row that has been activated multiple times is mainly used.

SUMMARY

Embodiments of the present invention are directed to a technology for increasing the defending capability of a memory against row hammering attacks.

In accordance with an embodiment of the present invention, a memory includes: a memory core; a list storage circuit suitable for storing a weak row list of rows that are vulnerable to a row hammer attack in the memory core; and a row hammer attack detection circuit suitable for selecting rows that are row-hammer-attacked among rows in the memory core as hammered rows and increasing a probability that the rows stored in the list storage circuit are selected as the hammered rows.

In accordance with another embodiment of the present invention, a memory includes: a memory core; a list storage circuit suitable for storing a weak row list of rows that are vulnerable to a row hammer attack in the memory core; a sampling circuit suitable for sampling and storing a portion of active addresses used for active operations of the memory core; and a selection circuit suitable for selecting one among the sampled addresses stored in the sampling circuit as a hammered row address in a predetermined order whenever a smart refresh operation is performed, wherein the selection circuit selects, when there is an address corresponding to a row stored in the list storage circuit among the sampled addresses, the row address as a hammered row address.

In accordance with yet another embodiment of the present invention, a memory includes: a memory core; a list storage circuit suitable for storing a weak row list of rows that are vulnerable to a row hammer attack in the memory core; and a row hammer attack detection circuit suitable for selecting a hammered row based on a number of times that rows of the memory core are activated, wherein the row hammer attack detection circuit is further suitable for giving a high weight to each of the numbers corresponding to the rows stored in the list storage circuit.

In accordance with still another embodiment of the present invention, a memory includes: a memory core; a list storage circuit suitable for storing a weak row list of rows that are vulnerable to a row hammer attack in the memory core; a sampling circuit suitable for sampling and storing a portion of active addresses used for active operations of the memory core and increasing a sampling probability of an active address corresponding to the rows stored in the list storage circuit among the active addresses; and a selection circuit suitable for selecting one among the sampled addresses stored in the sampling circuit as a hammered row address in a predetermined order whenever a smart refresh operation is performed.

In accordance with still another embodiment of the present invention, an operating method of a memory device including plural rows, the operating method comprises: performing active operations on selected rows in response to active commands, respectively; selecting, as a hammered row, a predetermined row over remaining rows among the selected rows; and refreshing rows adjacent to the hammered row.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

Figure 2:
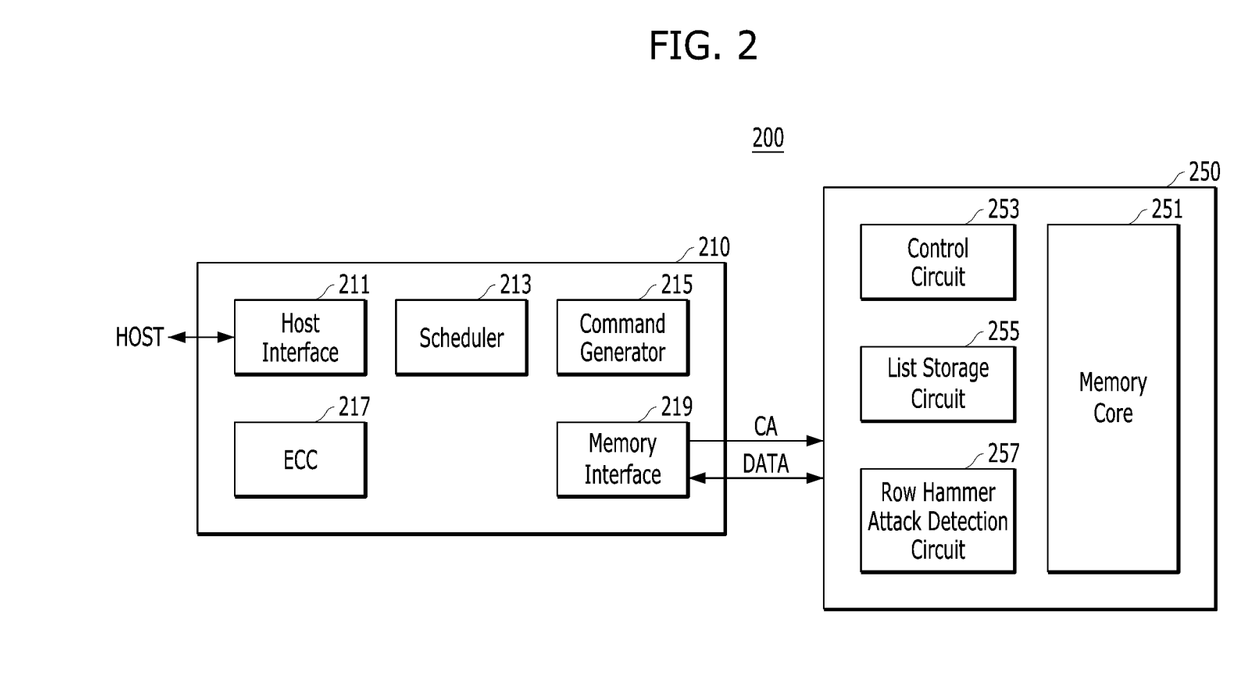
FIG. 2 is a block diagram illustrating a memory system 200 in accordance with an embodiment of the present invention.

FIG. 2 is a block diagram illustrating a memory system 200 in accordance with an embodiment of the present invention.

Referring to FIG. 2, the memory system 200 may include a memory controller 210 and a memory 250.

The memory controller 210 may control the operation of the memory 250 based on a request from a host HOST. The host HOST may include a Central Processing Unit (CPU), a Graphic Processing Unit (GPU), an Application Processor (AP), and the like. The memory controller 210 may include a host interface 211, a scheduler 213, a command generator 215, an error correction circuit 217, and a memory interface 219. The memory controller 210 may be included in a CPU, GPU, AP, and the like. In this case, the host HOST may mean the structure other than the memory controller 210 in these structures. For example, when the memory controller 210 is included in a CPU, the host HOST of the figure may represent the constituent elements excluding the memory controller 210 in the CPU.

The host interface 211 may be an interface between the memory controller 210 and the host HOST.

The scheduler 213 may determine the order of requests to be directed to the memory 250 among the requests from the host HOST. In order to improve the performance of the memory 250, the scheduler 213 may change the order of the requests received from the host HOST and the order of operations to be directed to the memory 250. For example, even though the host HOST requests a read operation of the memory 250 first and requests a write operation later, the scheduler 213 may change the order in such a manner that a write operation is performed before a read operation.

The command generator 215 may generate a command to be applied to the memory 250 according to the order of operations which is determined by the scheduler 213.

The error correction circuit 217 may detect and correct an error in the data stored in the memory 250. The error correction circuit 217 may generate an error correction code (ECC) based on the data to be written into the memory 250 during a write operation of the memory 250. The error correction code generated by the error correction circuit 217 may be stored in the memory 250 together with the write data. The error correction circuit 217 may detect an error in the data that are read from the memory 250 based on the error correction code that is read from the memory 250 during a read operation of the memory 250, and when an error is detected, the error correction circuit 217 may correct the detected error.

The memory interface 219 may be for an interface between the memory controller 210 and the memory 250. A command and an address CA may be transferred from the memory controller 210 to the memory 250 and data DATA may be transferred/received through the memory interface 219. The memory interface 219 may also be referred to as a PHY interface.

The memory 250 may perform an operation directed by the memory controller 210. The memory 250 may be a memory requiring a refresh operation. For example, the memory 250 may be a Dynamic Random Access Memory (DRAM) or another type of a memory requiring a refresh operation.

The memory 250 may include a memory core 251, a control circuit 253, a list storage circuit 255, and a row hammer attack detection circuit 257.

The control circuit 253 may control the overall operation of the memory 250. The control circuit 253 may control the internal constituent elements of the memory 250 to perform operations directed by a command and an address CA, such as an active operation, a precharge operation, a read operation, a write operation, and a refresh operation. Also, when a smart refresh operation is directed by the memory controller 210, the control circuit 253 may control the internal constituent elements of the memory 250 such that the row hammer attack detection circuit 257 may refresh the rows that are positioned adjacent to a row which is selected as a hammered row.

The memory core 251 may include a plurality of memory cells that are arranged in a plurality of rows and a plurality of columns. Also, the memory core 251 may include circuits for writing data into the memory cells and reading data from the memory cells.

The list storage circuit 255 may store a list of weak rows that are vulnerable to a row hammer attack among the rows of the memory core 251. The resistance to row hammer attacks of the rows of the memory core 251 may not be all the same. When the same row hammer attack occurs, most rows may not lose their data, but some weak rows may easily lose their data. The list storage circuit 255 may store a list of the weak rows that are vulnerable to row hammer attacks. For example, when a fifth row 5 is excessively activated and fourth and sixth rows 4 and 6 are likely to lose data, the row address of the fifth row 5 may be stored in the list storage circuit 255. Since the list storage circuit 255 has to retain the stored information even though the power of the memory 250 is turned off, it may include a nonvolatile memory circuit, such as an e-fuse array. The information stored in the list storage circuit 255, i.e., the list of the weak rows that are vulnerable to row hammer attacks, may be obtained through a test performed in the fabrication process of the memory 250 and recorded in the list storage circuit 255. According to an embodiment of the present invention, the list storage circuit 255 may not simply store the weak rows that are vulnerable to the row hammer attacks but may store information on the rows by dividing the degree of vulnerability to the row hammer attacks into multiple levels.

The row hammer attack detection circuit 257 may select the rows that are row-hammer-attacked among the rows activated in the memory core 251, that is, the rows that are activated excessively many times, as hammered rows. The row hammer attack detection circuit 257 may increase the probability of being selected as hammered rows for the rows stored in the list storage circuit 255, that is, the weak rows that are vulnerable to row hammer attacks, compared to the other rows. This is because data are more likely to be lost when a row stored in the list storage circuit 255 is row-hammer-attacked than when a general row is row-hammer-attacked. The row hammer attack detection circuit 257 may select a hammered row in many ways, which will be described in detail below with reference to FIGS. 3 to 5.

Figure 3:
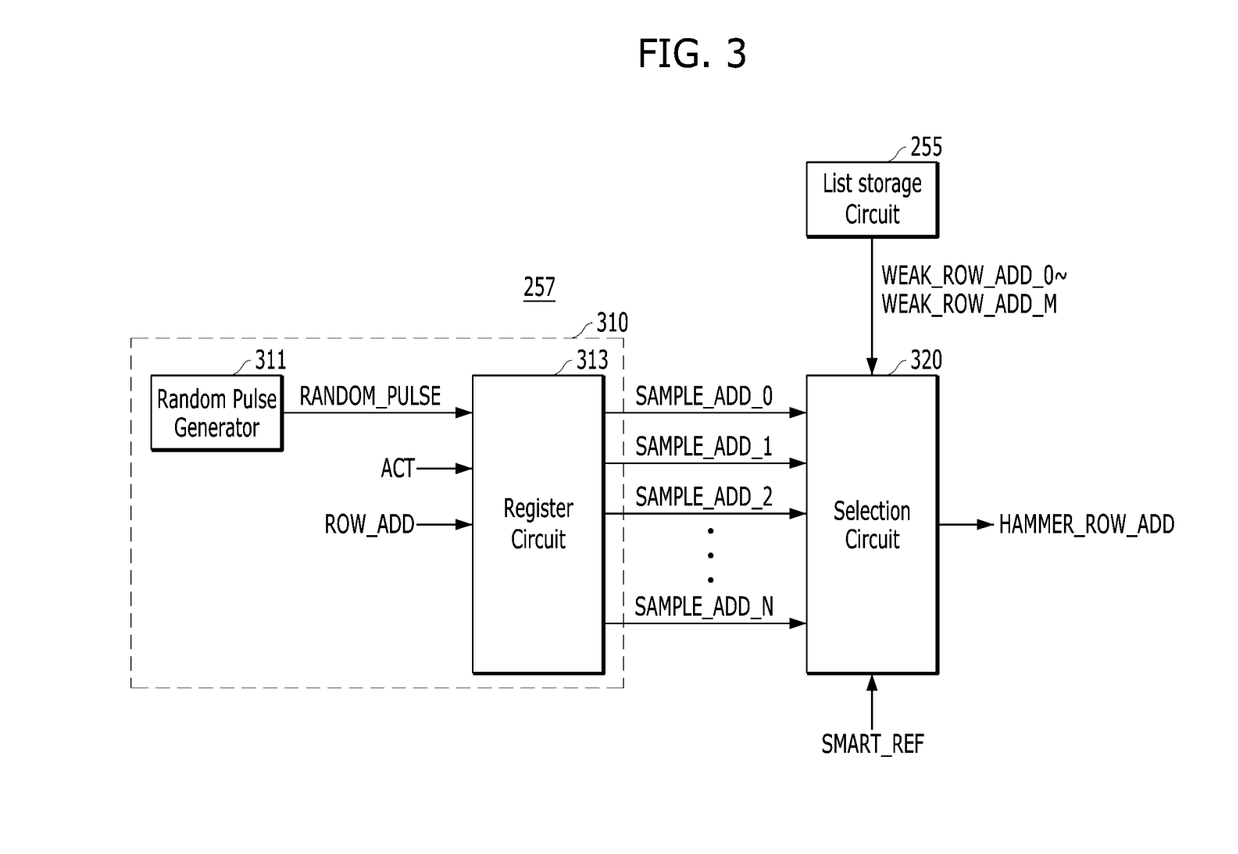
FIG. 3 is a block diagram illustrating a row hammer attack detection circuit 257 shown in FIG. 2 in accordance with a first embodiment of the present invention.

FIG. 3 is a block diagram illustrating the row hammer attack detection circuit 257 shown in FIG. 2 in accordance with a first embodiment of the present invention.

Referring to FIG. 3, the row hammer attack detection circuit 257 may include a sampling circuit 310 and a selection circuit 320.

The sampling circuit 310 may sample and store a portion of the addresses used in active operations of the memory core 251. The sampling circuit 310 may include a random pulse generator 311 and a register circuit 313.

The random pulse generator 311 may generate a random pulse RANDOM_PULSE, which is randomly activated.

The register circuit 313 may receive and store an address ROW_ADD that is used for an active operation, when an activation period of the random pulse RANDOM_PULSE and an activation period of an active signal ACT overlap with each other, that is, when the random pulse RANDOM_PULSE and the active signal ACT are simultaneously activated. The active signal ACT may be a signal that is activated during an active operation of the memory 250. The register circuit 313 does not store the address ROW_ADD if the random pulse RANDOM_PULSE is not activated even though the active signal ACT is activated, and the register circuit 313 stores the address ROW_ADD only when the active signal ACT and the random pulse RANDOM_PULSE are simultaneously activated. Therefore, the register circuit 313 may receive and store only some addresses among the addresses used for an active operation. Namely, the register circuit 313 may sample and store only some addresses among the numerous addresses that are used for an active operation. SAMPLE_ADD_0 to SAMPLE_ADD_N output from the register circuit 313 are addresses sampled by the register circuit 313.

The selection circuit 320 may select one among the sampled addresses SAMPLE_ADD_0 to SAMPLE_ADD_N in a predetermined order in each smart refresh operation in which a smart refresh signal SMART_REF is activated and output the selected sampled address as a hammered row HAMMER_ROW_ADD. For example, when the smart refresh signal SMART_REF is activated for the first time, the sampled address SAMPLE_ADD_0 may be selected as the hammered row HAMMER_ROW_ADD, and when the smart refresh signal SMART_REF is activated for the second time, the sampled address SAMPLE_ADD_1 may be selected as the hammered row HAMMER_ROW_ADD, that is, sequentially.

When there is an address which is the same as one on the weak row list WEAK_ROW_ADD_0 to WEAK_ROW_ADD_M stored in the list storage circuit 255 among the sampled addresses SAMPLE_ADD_0 to SAMPLE_ADD_N, the selection circuit 320 may select the row address as a hammered row HAMMER_ROW_ADD, regardless of the order, when the smart refresh signal SMART_REF is activated. For example, when the sampled address SAMPLE_ADD_3 is the same as one among the addresses WEAK_ROW_ADD_0 to WEAK_ROW_ADD_M that are on the weak row list, the selection circuit 320 may select the sampled address SAMPLE_ADD_3 prior to the other sampled addresses as a hammered row HAMMER_ROW_ADD. When there are two or more addresses that are the same as the addresses on the weak row list WEAK_ROW_ADD_0 to WEAK_ROW_ADD_M among the sampled addresses SAMPLE_ADD_0 to SAMPLE_ADD_N, the selection circuit 320 may select the addresses one by one in a predetermined order, for example, sequentially, as a hammered row HAMMER_ROW_ADD whenever the smart refresh signal SMART_REF is activated.

During a smart refresh operation, the rows positioned adjacent to the hammered row HAMMER_ROW_ADD which is selected by the selection circuit 320 may be refreshed.

In the row hammer attack detection circuit 257 of FIG. 3, the selection circuit 320 may preferentially select an address which is the same as one on the weak row list WEAK_ROW_ADD_0 to WEAK_ROW_ADD_M as the hammered row HAMMER_ROW_ADD among the sampled addresses SAMPLE_ADD_0 to SAMPLE_ADD_N. Therefore, the weak rows vulnerable to row hammer attacks may be more likely to be selected as hammered rows HAMMER_ROW_ADD than the other rows in the memory core 251.

Figure 4:
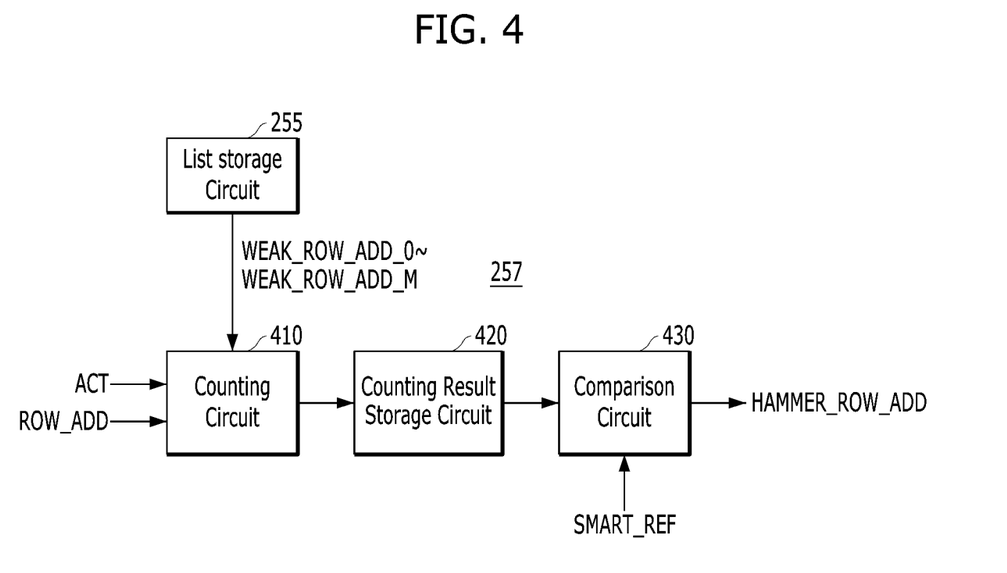
FIG. 4 is a block diagram illustrating a row hammer attack detection circuit 257 shown in FIG. 2 in accordance with a second embodiment of the present invention.

FIG. 4 is a block diagram illustrating the row hammer attack detection circuit 257 shown in FIG. 2 in accordance with a second embodiment of the present invention.

Referring to FIG. 4, the row hammer attack detection circuit 257 may include a counting circuit 410, a counting result storage circuit 420, and a comparison circuit 430.

The counting circuit 410 may count the number of active operations of the rows of the memory core 250. The counting circuit 410 may count how many times the rows of the memory core 250 are activated by using the active signal ACT and the address ROW_ADD. The counting circuit 410 may use a full counting method of counting all active operations, or may use a method of sampling and counting only some randomly sampled active operations among the active operations.

The counting circuit 410 may increase the counting value of a corresponding row by +1 whenever the rows of the memory core 250 are activated. For example, when the counting value of a $100^{th}$ row is 3 and an active operation is performed on the $100^{th}$ row, the counting circuit 410 may increase the counting value of the $100^{th}$ row by +1 to 4. However, the counting circuit 410 may give weight to the counting of the rows corresponding to the weak row list WEAK_ROW_ADD_0 to WEAK_ROW_M stored in the list storage circuit 255. That is, when the rows corresponding to the weak row list WEAK_ROW_ADD_0 to WEAK_ROW_M are activated, it may increase the counting value of the corresponding row by +X, where X is an integer equal to or greater than 2. For example, when a $50^{th}$ row is a weak row corresponding to the weak row list and the counting value is 4 and an active operation is performed on the $50^{th}$ row, the counting circuit 410 may increase the counting value of the $50^{th}$ row by +2 to 6.

The counting result for each row of the counting circuit 410 may be stored in the counting result storage circuit 420.

The comparison circuit 430 may compare the counting result values of the rows stored in the counting result storage circuit 420 whenever the smart refresh signal SMART_REF is activated, and select and output the row with the largest counting result value as the hammered row HAMMER_ROW_ADD. For example, when the counting result stored in the counting result storage circuit 420 is as shown in Table 1 below, the comparison circuit 430 may select a $10^{th}$ row having the largest counting result value as the hammered row HAMMER_ROW_ADD.

TABLE 1

| Row | Counting Value |
|---|---|
| $3^{th}$ row | 150 |
| $10^{th}$ row | 900 |
| $76^{th}$ row | 50 |
| ... | ... |
| $101^{th}$ row | 200 |

In the row hammer attack detection circuit 257 of FIG. 4, when the counting circuit 410 counts the active number of times, it may give a weight to the rows corresponding to the weak row list. Thus, the weak rows vulnerable to row hammer attacks may be more likely to be selected as hammered rows than the other rows in the memory core 251.

Figure 5:
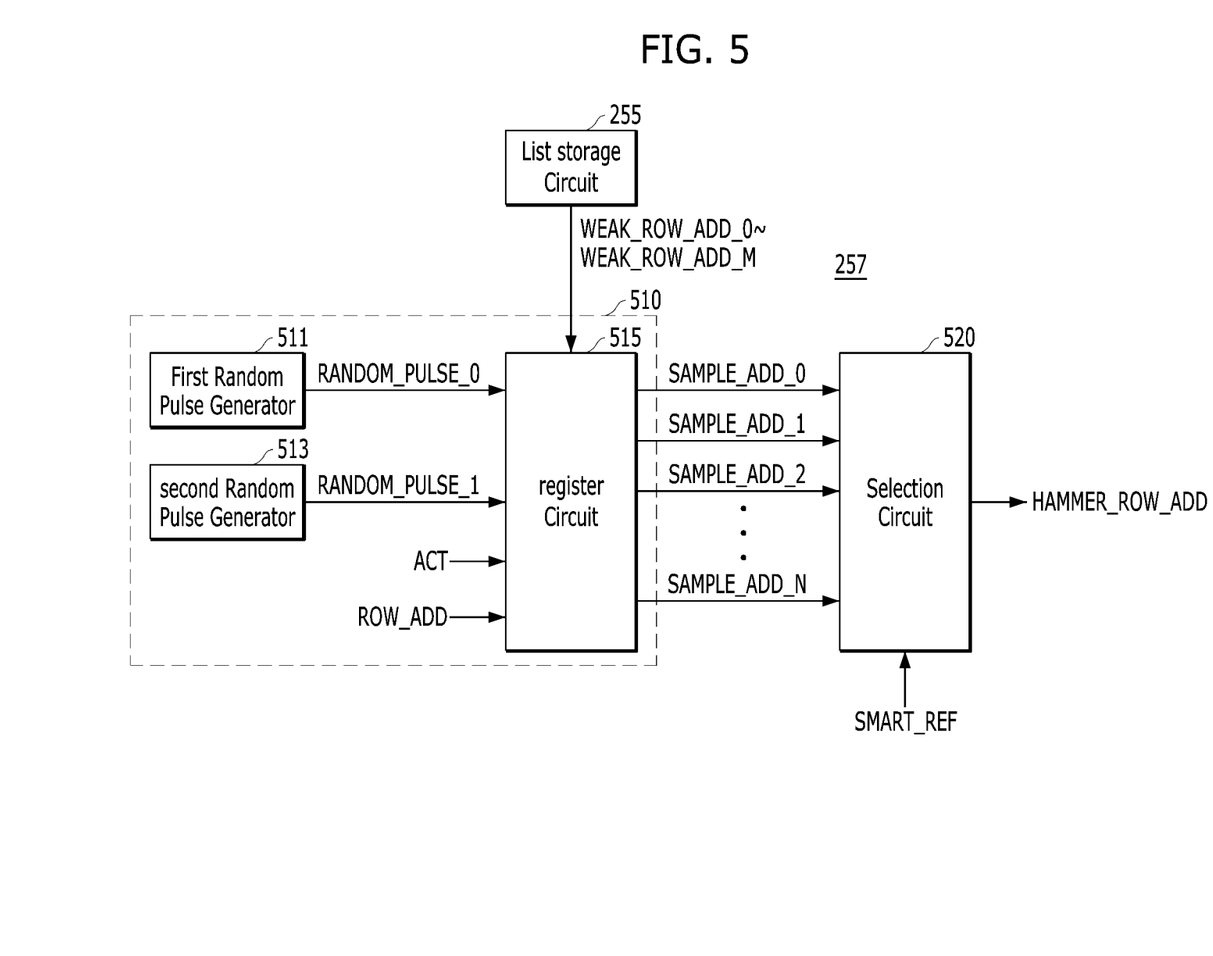
FIG. 5 is a block diagram illustrating a row hammer attack detection circuit 257 shown in FIG. 2 in accordance with a third embodiment of the present invention.

FIG. 5 is a block diagram illustrating the row hammer attack detection circuit 257 shown in FIG. 2 in accordance with a third embodiment of the present invention.

Referring to FIG. 5, the row hammer attack detection circuit 257 may include a sampling circuit 510 and a selection circuit 520.

The sampling circuit 510 may sample and store a portion of the addresses used for active operations of the memory core 251. The sampling circuit 510 may increase the sampling probability of the addresses corresponding to the weak row list WEAK_ROW_ADD_0 to WEAK_ROW_ADD_M stored in the list storage circuit 255 higher than the addresses that are not.

The sampling circuit 510 may include a first random pulse generator 511, a second random pulse generator 513, and a register circuit 515.

The first random pulse generator 511 may generate a first random pulse RANDOM_PULSE_0 which is randomly activated. The second random pulse generator 513 may generate a second random pulse RANDOM_PULSE_1 which is randomly activated. The second random pulse RANDOM_PULSE_1 may be activated more frequently than the first random pulse RANDOM_PULSE_0.

When the address ROW_ADD used for an active operation does not correspond to the weak row list WEAK_ROW_ADD_0 to WEAK_ROW_ADD_M stored in the list storage circuit 255, the register circuit 515 may sample and store the address ROW_ADD based on the first random pulse RANDOM_PULSE_0. When the address ROW_ADD used for an active operation corresponds to the weak row list WEAK_ROW_ADD_0 to WEAK_ROW_ADD_M stored in the list storage circuit 255, the register circuit 515 may sample and store the address ROW_ADD based on the second random pulse RANDOM_PULSE_1.

To be specific, when both of the first random pulse RANDOM_PULSE_0 and the active signal ACT are activated and the address ROW_ADD does not correspond to the weak row list WEAK_ROW_ADD_0 to WEAK_ROW_ADD_M, the register circuit 515 may receive and store the address ROW_ADD. Also, when both of the second random pulse RANDOM_PULSE_1 and the active signal ACT are activated and the address ROW_ADD corresponds to the weak row list WEAK_ROW_ADD_0 to WEAK_ROW_ADD_M, the register circuit 515 may receive and store the address ROW_ADD.

The selection circuit 520 may select one among the sampled addresses SAMPLE_ADD_0 to SAMPLE_ADD_N in a predetermined order whenever a smart refresh operation in which the smart refresh signal SMART_REF is activated is performed and output the selected sampled address as the hammered row HAMMER_ROW_ADD. For example, when the smart refresh signal SMART_REF is activated for the first time, the selection circuit 520 may select the sampled address SAMPLE_ADD_0 as the hammered row HAMMER_ROW_ADD, and when the smart refresh signal SMART_REF is activated for the second time, the selection circuit 520 may select the sampled address SAMPLE_ADD_1 as the hammered row HAMMER_ROW_ADD.

The sampling circuit 510 of the row hammer attack detection circuit 257 of FIG. 5 may sample the general rows with a low probability when an active operation is performed while sampling the rows stored in the list storage circuit 255 with a high probability. Accordingly, the weak rows vulnerable to the row hammer attacks are more likely to be selected as hammered rows than the other rows in the memory core 251.

As a modified example of the sampling circuit 510, only one random pulse generator (e.g., 511) may be used. In this case, when the address ROW_ADD used for an active operation corresponds to the weak row list WEAK_ROW_ADD_0 to WEAK_ROW_ADD_M stored in the list storage circuit 255, the register circuit 515 may sample the address ROW_ADD once whenever the random pulse RANDOM_PULSE_0 pulses X times. When the address ROW_ADD used for an active operation does not correspond to the weak row list WEAK_ROW_ADD_0 to WEAK_ROW_ADD_M stored in the list storage circuit 255, the register circuit 515 may sample the address ROW_ADD once whenever the random pulse RANDOM_PULSE_0 pulses Y times (where Y>X). For example, when X is 1 and Y is 2 and when the address ROW_ADD used for an active operation corresponds to the weak row list WEAK_ROW_ADD_0 to WEAK_ROW_ADD_M stored in the list storage circuit 255, the register circuit 515 may use the random pulse RANDOM_PULSE_0 as it is. When the address ROW_ADD used for an active operation does not correspond to the weak row list WEAK_ROW_ADD_0 to WEAK_ROW_ADD_M stored in the list storage circuit 255, the register circuit 515 may activate the random pulse RANDOM_PULSE_0 at a rate of one time out of 2 times to sample the address. Through this operation, the sampling circuit 510 may sample the general rows with a low probability and sample the rows stored in the list storage circuit 255 with a higher probability, when an active operation is performed.

According to the embodiment of the present invention, it is possible to increase a defending capability of a memory against row hammering attacks.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to specific embodiments, it will be apparent to those skilled in the art that various changes and modifications may be made without departing from the spirit and scope of the invention as defined in the following claims.

What is claimed is:

1. A memory comprising:
   a memory core;
   a list storage circuit suitable for storing a weak row list that includes a list of rows that have been determined to be more vulnerable to a row hammer attack and data loss, as compared to other rows in the memory core also row hammered attacked, wherein the rows more vulnerable to the row hammer attack are divided into multiple levels according to a degree of vulnerability; and a row hammer attack detection circuit suitable for selecting rows that are row-hammer-attacked among rows in the memory core as hammered rows, wherein the row hammer attack detection circuit increases a probability that the rows in the list of rows that have been determined to be more vulnerable to a row hammer attack and data loss in the list storage circuit are selected as the hammered rows.

2. The memory of claim 1, wherein rows positioned adjacent to the hammered row which is selected by the row hammer attack detection circuit are refreshed during a smart refresh operation of the memory.

3. A memory comprising:

a memory core;

a list storage circuit suitable for storing a weak row list that includes a list of rows that have been determined to be more vulnerable to a row hammer attack and data loss, as compared to other rows in the memory core also row hammered attacked, wherein the rows more vulnerable to the row hammer attack are divided into multiple levels according to a degree of vulnerability;

a sampling circuit suitable for sampling and storing a portion of active addresses used for active operations of the memory core and increasing a sampling probability of an active address corresponding to the rows stored in the list storage circuit among the active addresses; and a selection circuit suitable for selecting one among the sampled addresses stored in the sampling circuit as a hammered row address in a predetermined order whenever a smart refresh operation is performed, wherein the selection circuit selects, when there is an address corresponding to a row stored in the list storage circuit among the sampled addresses, the row address as a hammered row address, and wherein the selection circuit increases a probability that the rows in the list of rows that have been determined to be more vulnerable to a row hammer attack and data loss in the list storage circuit are selected as the hammered rows.

4. The memory of claim 3, wherein the sampling circuit includes:

a random pulse generator suitable for generating a random pulse; and a register circuit suitable for sampling and storing a row address when an active signal is activated in an activation period of the random pulse.

5. The memory of claim 3, wherein the selection circuit selects, when there are a plurality of addresses corresponding to the rows stored in the list storage circuit among the sampled addresses, one among the corresponding addresses as a hammered row address in a predetermined order whenever the smart refresh operation is performed.

6. The memory of claim 3, wherein rows positioned adjacent to the hammered row which is selected by the selection circuit are refreshed during a smart refresh operation of the memory.

7. The memory of claim 1, wherein the row hammer attack detection circuit includes a sampling circuit suitable for sampling and storing a portion of active addresses used for active operations of the memory core and increasing a sampling probability of an active address corresponding to the rows stored in the list storage circuit among the active addresses.

8. The memory of claim 1, wherein, in the list storage circuit, the list of rows determined to be more vulnerable than other rows in the memory device also row attacked is determined at a time of manufacture of the memory device.

9. A memory comprising:

a memory core;

a list storage circuit suitable for storing a weak row list of rows that are determined to be more vulnerable to a row hammer attack, as compared to the other rows in the memory core, wherein the rows more vulnerable to the row hammer attack are divided into multiple levels according to a degree of vulnerability; and a row hammer attack detection circuit suitable for selecting rows that are row-hammer-attacked among rows in the memory core as hammered rows and increasing a probability that the rows stored in the list storage circuit are selected as the hammered rows, wherein the row hammer attack detection circuit samples the other rows, except the rows stored in the list storage circuit, with a low probability when an active operation is performed while the rows stored in the list storage circuit are sampled with a high probability.

* * * * *